United States Patent
Dacanay et al.

(10) Patent No.: US 6,808,943 B2
(45) Date of Patent: Oct. 26, 2004

(54) METHOD OF FABRICATING WIRE BOND INTEGRITY TEST SYSTEM

(75) Inventors: Allan I. Dacanay, La Union (PH); Raymond M. Partosa, Baguio (PH); Enrique R. Ferrer, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 239 days.

(21) Appl. No.: 10/165,871

(22) Filed: Jun. 10, 2002

(65) Prior Publication Data

US 2003/0227016 A1 Dec. 11, 2003

(51) Int. Cl.⁷ .................................. H01L 21/66
(52) U.S. Cl. ......................... 438/11; 438/14; 438/17; 438/18
(58) Field of Search .................. 438/11–18; 257/48

(56) References Cited

U.S. PATENT DOCUMENTS 5,302,550 A * 4/1994 Hirota et al. ............... 438/106
6,713,881 B2 * 3/2004 Umehara et al. ........... 257/786

* cited by examiner

*Primary Examiner*—Thanh Nguyen
(74) *Attorney, Agent, or Firm*—Yingsheng Tung; Wade James Brady, III; Frederick J. Telecky, Jr.

(57) ABSTRACT

An improved bond integrity test system is provided by eliminating the spring loaded wire spool cover which contributes to particulate matter, and by addition of a second contact diverter in the wire path. These improvements have been shown to decrease false lifted ball bond reports by 68%, and therefore to improve productivity and accuracy of the test system. Such changes are readily adapted to current bonders, as well as to new designs.

5 Claims, 3 Drawing Sheets

METHOD OF FABRICATING WIRE BOND INTEGRITY TEST SYSTEM

FIELD OF THE INVENTION

This invention relates generally to the assembly of semiconductor devices, and more specifically to wire bonding equipment, and wire bond testing systems.

BACKGROUND OF THE INVENTION

Automated wire bonders are employed to make electrical connections between input/output (I/O) pads of semiconductor chips and conductive leads on substrates or lead frames. Most often, each connection is made by way of a very thin gold wire, fed from a spool, through a series of control mechanisms to a capillary where by a combination of heat and ultrasonic energy, a first or ball bond is attached to the chip pad, and a second or stitch bond to the substrate. State-of-the-art bonders operate at very high speeds. For example one interconnection every 250 milliseconds is not an unusual bonding rate.

High-speed bonding equipment is typically programmed by a technician or operator for a selected device lot, the materials are supplied, and the equipment is then expected to operate continuously throughout the required production lot. Highly automated equipment allows one operator or technician to be responsible for several bonding machines. Work stoppages, often signaled by a red light positioned atop the equipment, can occur if the machine is out of material, or if a failure in the bonding cycle is detected. Excessive stoppage events require additional operators, increase cycle time, lower production rates, and generally contribute to an increase in the device cost, and a decrease in productivity.

Many automated wire bonders include sophisticated systems, called bond integrity test systems or "BITS", intended to detect any failure to make good bonding contact, either to the chip pad, or to the lead. They may also detect an improperly threaded or positioned wire, as required to initiate the next bonding sequence. Frequently work stoppages result from a reported failure of a "lifted ball bond". An example of a lifted ball bond is illustrated in FIG. 1. This failure is correctly detected by the bond integrity test system, as a failure. It can be seen that the gold ball 15 is not in intimate contact with the bond pad 16 of the semiconductor device, and therefore, an intermittent or incomplete circuit is detected.

In FIG. 2, the ball bond 25 is in intimate contact with the pad 26. However, the bonder BITS frequently reports an erroneous "lifted ball" signal, which in turn requires the attention of an operator to investigate the cause, define the correction, and restart the bonding cycle.

While bond integrity tests do generate a number of erroneous readings, it is necessary that high speed bonders include these automated tests, because failure to detect mis-bonds during the process, and halt the bonding, destroy a large number of chips and substrates if a correction were not made. Without a detection mechanism, there could be a significant cost increase for additional operators and surveillance to minimize the number of devices erroneously bonded.

One common erroneous reading is a "false lifted ball"; a false indication that the ball bond to the chip pad is not properly connected. Typically, the bond integrity test system operates by applying a DC voltage through a current resistor on the electrically isolated bond wire, and providing a means for monitoring the current flow from the device pad to a machine chassis ground. This requires that the wire be insulated or otherwise isolated at the wire feed, and that the fine wire be grounded at the semiconductor or at the work station. Usually, the bonding tool and wire feed are isolated so that the current path from the voltage source is directed through the fine wire to the pad on the device, and to ground. The device under assembly is grounded and a small sense current will flow when the wire has been successfully attached. If the voltage source can be made stable, changes in the observed current are proportional to the impedance of the fine wire, plus the impedance of the device being bonded. However, very small changes will be detected, and a failure reported, whether real or false. The fault is detected in the continuity signature, and a shift in the signature may cause a work stoppage.

Necessarily, bond integrity detection systems are very sensitive, which contributes to the fact that they do cause a number of false work stoppages. Attempts to raise the voltage or current in the fine wire to generate a larger current flow so as to provide larger values for error detection often are harmful to the device under assembly, and therefore, is not an acceptable solution.

An improved BITS system which would eliminate, or minimize the number of erroneous bond failure detections at the first bond would be very beneficial to the industry. It would be particularly helpful if a low cost modification to existing bonders were provided.

SUMMARY OF THE INVENTION

It is an object of the current invention to provide an improved bond integrity detection system which minimizes errors at the first bond.

It is further an object of the invention to provide a simple modification of existing detection systems.

It is an object of the invention to provide such a modification at low cost.

It is an object of the invention to minimize particulate contamination from the wire spool assembly, and thereby reduce the number of erroneous reports of lifted or non-sticking bonds.

It is an object of the invention to provide a more accurate test system, and thereby to increase bonder productivity.

The above and other objectives are met by providing modifications to known bond integrity test systems, which may also be applied to new bonders. The improved modification includes first removing the conventional brass spring wire spool clip which is a source of particles; and second, installing an auxiliary diverter which allows a more even flow of the wire as it is unwound from the spool, thereby relieving tension, and avoiding an erroneous test report. The second diverter provides an additional contact point for sensing the small current flows, thus adding to the accuracy of the test system.

Further objectives and advantages will become apparent from consideration of the drawings together with the ensuing description.

DETAILED DESCRIPTION OF THE INVENTION

Figure 3:
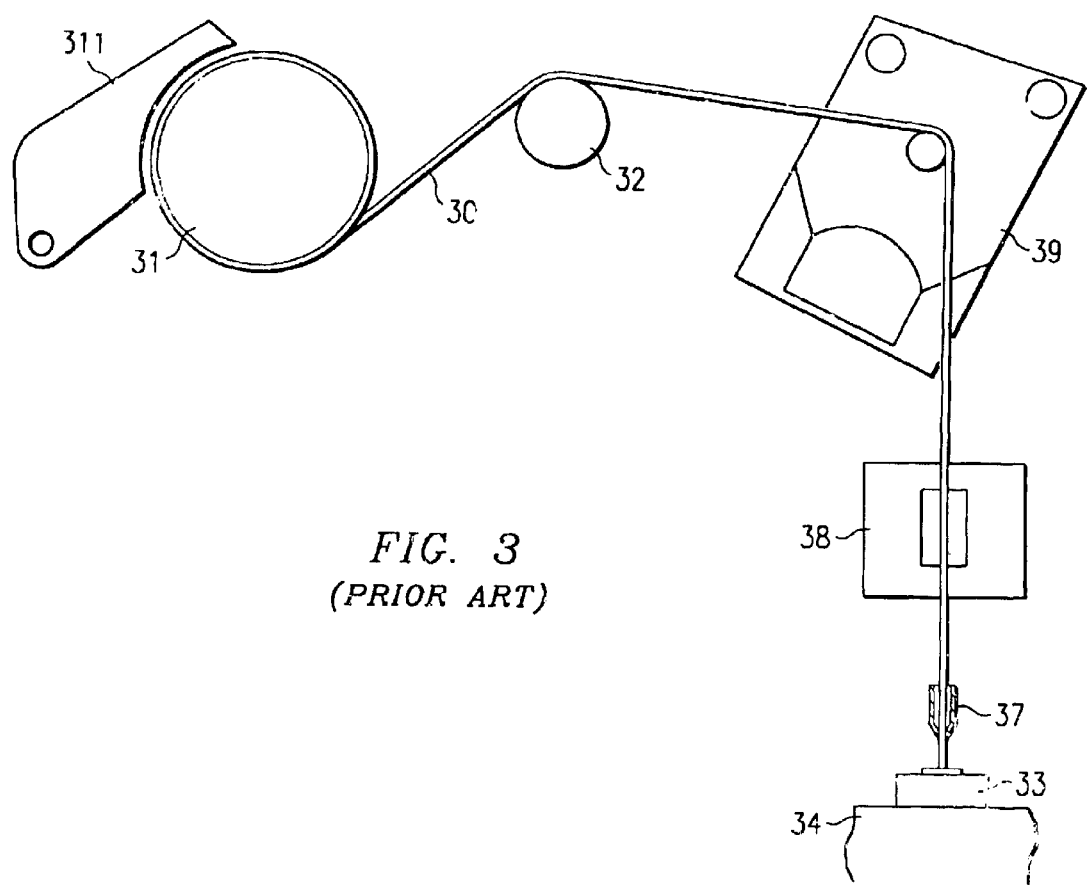
FIG. 3 schematically illustrates the path of bond wire on existing bonders having a single diverter.

FIG. 3 schematically depicts the path followed by the bond wire on many existing wire bonders. A fine gold wire 30, twenty-five microns or less in diameter, is fed from a wire spool assembly 31 to a protruding contact and guide mechanism 32, commonly referred to as a diverter. Diverter 32 makes electrical and mechanical contact with the wire 30, and helps control tension on the wire. The spool assembly 31 includes a wire wound spool and a spring held cover 311 for contacting the wire as it is fed from the spool.

The path of the wire continues through an air guide 39, a complex wire clamp assembly 38, and an insulating ceramic capillary 37. A ball formed at the end of the capillary is brought into contact with the bond pad of a grounded semiconductor device 33, situated on the work station 34 of a bonder. A transducer is energized to produce current and force for a sufficient time to cause the formed ball to bond to the pad while the wire clamp is in the open state. After the transducer time has elapsed, the bond head will lift and proceed to the second bond. If poor contact between the ball and bond pad is detected, a "lifted or non-sticking ball" is reported by the bond integrity test system (BITS). A poor contact signal may result from a true bond failure, from improper grounding, or often from contamination.

Figure 1:
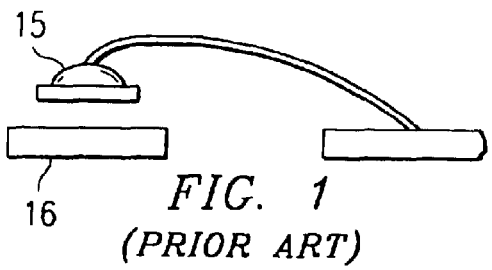
FIG. 1 illustrates a lifted ball bond failure. (Prior art)
Figure 2:
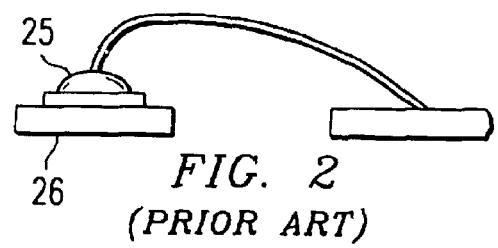
FIG. 2 illustrates a good bond, erroneously detected as a lifted ball. (Prior art)
Figure 4:
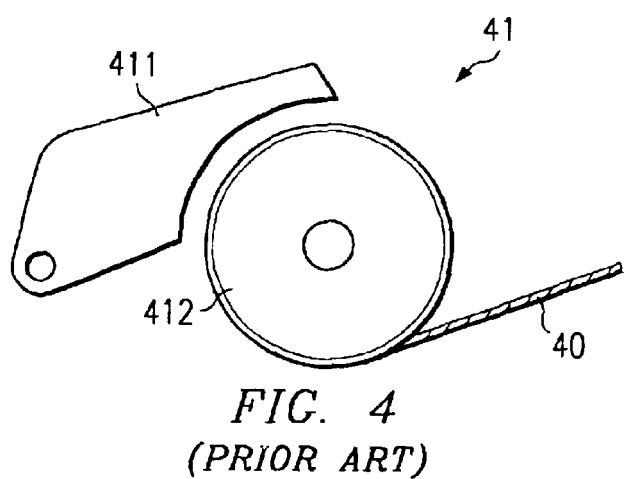
FIG. 4 illustrates a wire spool assembly. (Prior art)

As shown in FIG. 4, the wire spool assembly 41, includes a wire cover 411, typically a spring loaded leaf shaped brass device which serves both to direct the wire 40 coming from the spool 412, and as a grounding point for the wire, needed by the BITS system. However, friction between the cover 411 and the wire spool holder has been shown to cause particulate matter to be generated as the spool rotates, which can be deposited on the bond pad or wire, and can interfere with contact between wire and diverter.

A low level DC current is applied to the bond wire through a current resistor, and circuit impedance from the device bond pad to the bonding machine chassis ground is monitored and relayed to a BITS board. The device under assembly and test is grounded, and the continuity signature of the current flow detects whether the wire has been successfully attached. Contact to the wire and BITS sensor is made at the diverter 32 (FIG. 3), on its path to the semiconductor chip 34.

Perturbations in the current signature are detected by the BITS test, and a lifted ball is reported, whether the failure is real or false. Approximately 40% of the bonder work stoppages attributed to lifted balls actually are the result of erroneous readings. Erroneous readings may be the result of poor or marginal contact of the wire to the diverter, and this simply may be due to excessive tension on the wire caused by spring loaded spool cover lifting the wire from its intended path.

Figure 5:
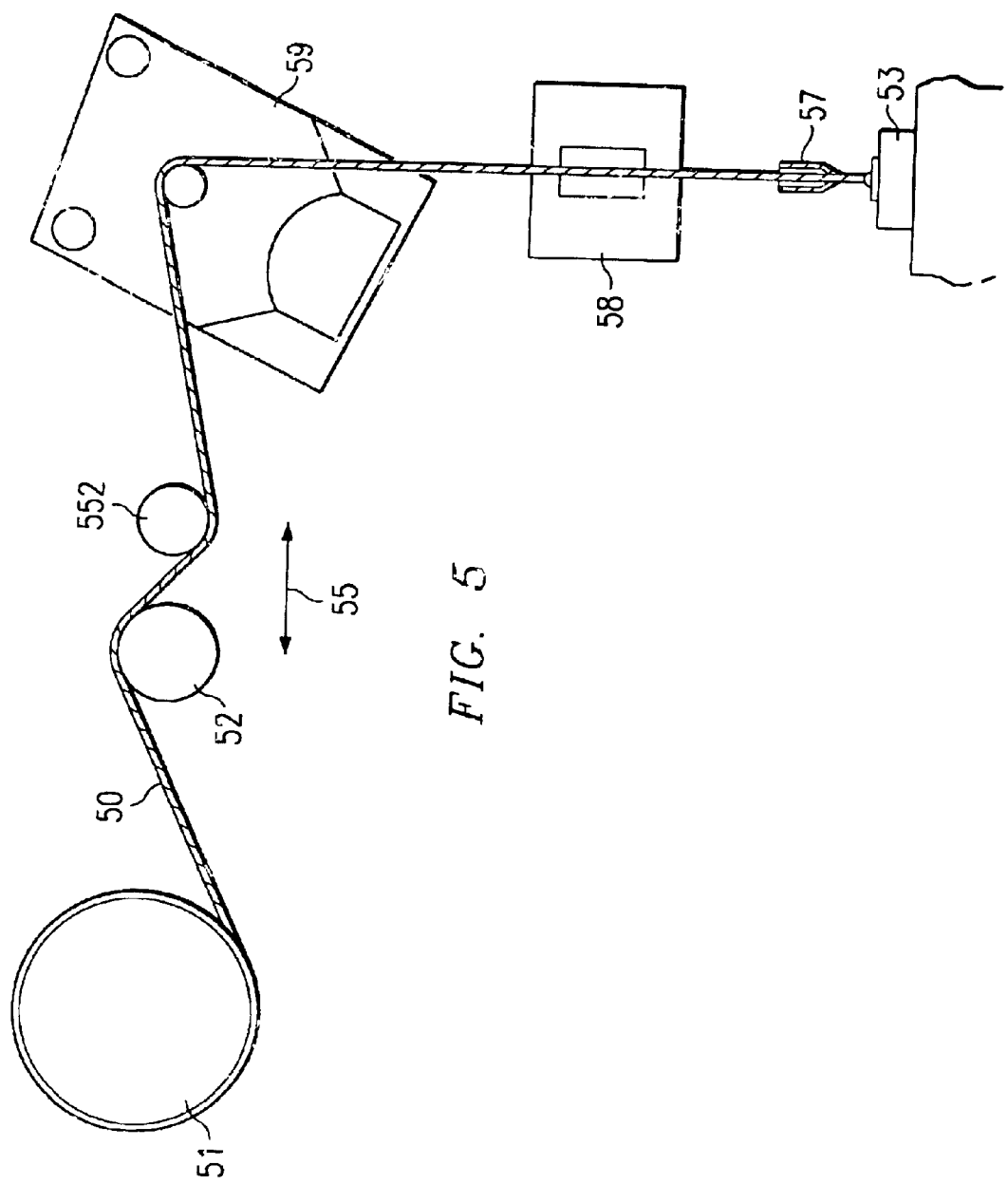
FIG. 5 is a schematic diagram of the path of a bond wire with the double diverter of the current invention.

FIG. 5 illustrates the bond wire path with the improved bond integrity test system, including a double diverter assembly. Addition of the second diverter significantly increases the probability of making good electrical contact to the wire. Not only are there two diverter sites for increased contact, but also, the double diverter system relieves tension on the wire, therefore allowing smoother wire movement. The gold wire 50 fed from the spool 51 is directed to cross the top of the first diverter 52, proceed downward to contact the second diverter 552 before continuing through the air guide 59, the wire clamp assembly 58, and the capillary 57. A ball bond is formed on a bond pad of a grounded semiconductor chip 53, and the current flow is detected by the BITS system board.

An additional modification to existing bonder designs, and included in the improved bond integrity test system with double diverter assembly is provided by eliminating the wire spool cover 411, typically found on existing designs, as shown in FIG. 4. The spring loaded metallic cover is intended to guide the wire and provide a contact point. Friction between the cover and wire spool holder generated as the spool rotates has been found to be a source of particulate contamination. Any form of particulate contamination which can interfere with the current flow, and/or continuity signature, and which may or may not result in an actual lifted ball bond will result in a false response from the test system of "lifted ball". It is of utmost importance to the bonding operation that particulate matter which can be disposed between the ball bond and bond pad be eliminated. Therefore, elimination of the spring loaded cover, and making a more reliable contact with the wire at the second diverter provides an improved test system.

Figure 6:
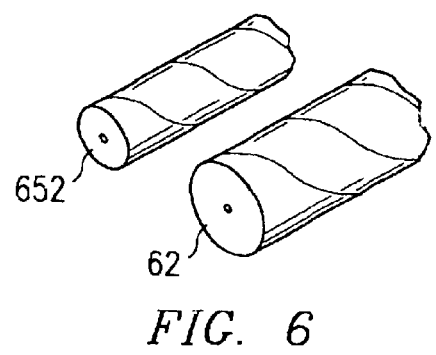
FIG. 6 also illustrates the double diverter system of the current invention.

The double diverter assembly of the invention is shown in greater detail in FIG. 6. In a preferred embodiment, the first diverter 62 is typically an electroplated stainless steel cylinder, about 19 mm in diameter. The second diverter 652 is also an electroplated stainless steel cylinder of smaller diameter, about 12 mm. The cylinders protrude from the surface of the bonder, and are positioned so that the centers are approximately 34 mm apart. Precise dimensions of the cylinders may vary, with the second diverter being about 30–35% smaller in diameter than the first. Spacing between the diverters is 2 to 2.5 times the combined radii of the two cylinders. A fine gold wire 60 is fed across and contacts the top of the first diverter 62, and proceeds downward across the bottom of a second diverter 652. Both the first 62 and second 652 diverters comprise a hard metal, such as stainless steel electroplated with a conductive coating.

In an alternate embodiment, additional diverters may be added wherein the third diverter is about 30% smaller than the second, and is positioned about 2 to 2.5 times the radii of the second and third diverter from the second.

The improved bond test system includes an isolated bond wire fed from a spool assembly without a cover, double diverters for reliable contact and relieved wire tension, and an isolated feed system through a capillary to a grounded chip. DC current applied to the wire is monitored, and abnormalities reported as "lifted ball bonds". The test method includes applying a small DC current to the isolated wire and monitoring the current flow signature between the wire and grounded chip bond pad.

Relatively small changes in the mechanical design of the diverter system of existing bonders, including elimination of a wire spool cover, and addition of a second diverter provide significant improvements to the bond integrity system by eliminating tension on the wire, by minimizing particulate contamination, and by increasing the probability of good electrical contact with the wire. These changes significantly minimize the number of false errors and bonder stoppages, and reduce the associated manpower and productivity costs. Further, the changes require no major changes to the BITS detection system, and require no additional piece part inventory.

An improved system and method for detection of ball bond integrity which minimizes the probability of erroneous readings has been disclosed with respect to known wire bonders. However, it will be recognized that the improved system is also applicable to new equipment designs, and that modifications and variations will become apparent to those skilled in the art. It is therefore intended that the appended claims be interpreted as broadly as possible in view of the prior art.

What is claimed is:

1. An improved method for automated in process ball bond integrity testing including the following steps:

applying a DC voltage source to an isolated gold wire fed from a spool assembly wherein said assembly includes no cover, feeding said wire across the top of a first contact diverter, and across the bottom side of a second contact diverter, directing the wire through an insulating wire clamp assembly and capillary, forming a ball, bringing the ball into contact with a semiconductor device positioned on a grounded work station, applying current and force to form a bond, and monitoring the signature of the current flow.

2. A method as in claim 1 wherein abnormal current flow is reported as a lifted ball.

3. A method as in claim 1 wherein particulate contamination from the wire spool assembly is minimal.

4. A method as in claim 1 wherein the DC current is applied through a current resistor.

5. A method as in claim 1 wherein said double diverters provide two locations for contact to the wire.

* * * * *